(12) United States Patent
Miyazawa et al.

(10) Patent No.: US 11,215,971 B2
(45) Date of Patent: *Jan. 4, 2022

(54) SUPPORT SYSTEM AND NON-TRANSITORY COMPUTER READABLE MEDIUM

(71) Applicant: FUJIFILM Business Innovation Corp., Tokyo (JP)

(72) Inventors: Yasuaki Miyazawa, Kanagawa (JP); Makoto Fuchigami, Kanagawa (JP); Kimihiro Wakabayashi, Kanagawa (JP); Yoshikazu Okamoto, Kanagawa (JP); Hiroshi Murano, Kanagawa (JP); Nobukazu Takahashi, Kanagawa (JP); Masaki Suda, Kanagawa (JP); Mari Horie, Kanagawa (JP); Naoki Koike, Kanagawa (JP); Masao Okubo, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 210 days.

This patent is subject to a terminal disclaimer.

(21) Appl. No.: 16/553,157

(22) Filed: Aug. 27, 2019

(65) Prior Publication Data

US 2020/0241504 A1 Jul. 30, 2020

(30) Foreign Application Priority Data

Jan. 28, 2019 (JP) .............................. JP2019-012370

(51) Int. Cl.
*G06F 11/00* (2006.01)
*G05B 19/4097* (2006.01)
(Continued)

(52) U.S. Cl.
CPC .......... *G05B 19/4097* (2013.01); *G06F 11/00* (2013.01); *G06F 11/0703* (2013.01);
(Continued)

(58) Field of Classification Search
CPC .. G06F 11/00; G06F 11/0703; G06F 11/2252; G06F 11/2257; G06N 5/02
See application file for complete search history.

(56) References Cited

U.S. PATENT DOCUMENTS 10,437,657 B2 * 10/2019 Wakabayashi .......... G06F 30/00
11,010,238 B2 * 5/2021 Gonoji ................ G06F 11/0727
(Continued)

FOREIGN PATENT DOCUMENTS

| JP | 4428110 | 3/2010 |
| JP | 2018132882 | 8/2018 |

*Primary Examiner* — Philip Guyton
(74) *Attorney, Agent, or Firm* — JCIPRNET

(57) ABSTRACT

A design support system includes memory, a receiving unit, and an associating unit. The memory stores information on design element classification that classifies a design element included in a product, and information on design requirement classification that classifies a design requirement required for the product. The receiving unit receives technical information regarding a design trouble. The associating unit refers to technical information regarding a design trouble, received by the receiving unit, and associates a classification item in the design requirement classification to which the design trouble belongs and a classification item in the design element classification to which a design element causing the design trouble belongs with each other, along with information on a phenomenon indicating a failure status of the design element included in the technical information.

13 Claims, 17 Drawing Sheets

(51) Int. Cl.
  *G06N 5/02* (2006.01)
  *G06F 11/22* (2006.01)
  *G06F 11/07* (2006.01)
(52) U.S. Cl.
  CPC ........... *G06F 11/2257* (2013.01); *G06N 5/02* (2013.01); *G05B 2219/35026* (2013.01)

(56) References Cited

U.S. PATENT DOCUMENTS

| | | |
|---|---|---|
| 2004/0205040 A1 | 10/2004 | Yoshioka et al. |
| 2018/0137129 A1* | 5/2018 | Matsuo ................... G06F 16/93 |
| 2018/0232271 A1 | 8/2018 | Wakabayashi et al. |
| 2019/0243332 A1* | 8/2019 | Kamiguchi ........ G05B 23/0221 |
| 2021/0122609 A1* | 4/2021 | Meierhans ............ B66B 25/006 |

* cited by examiner

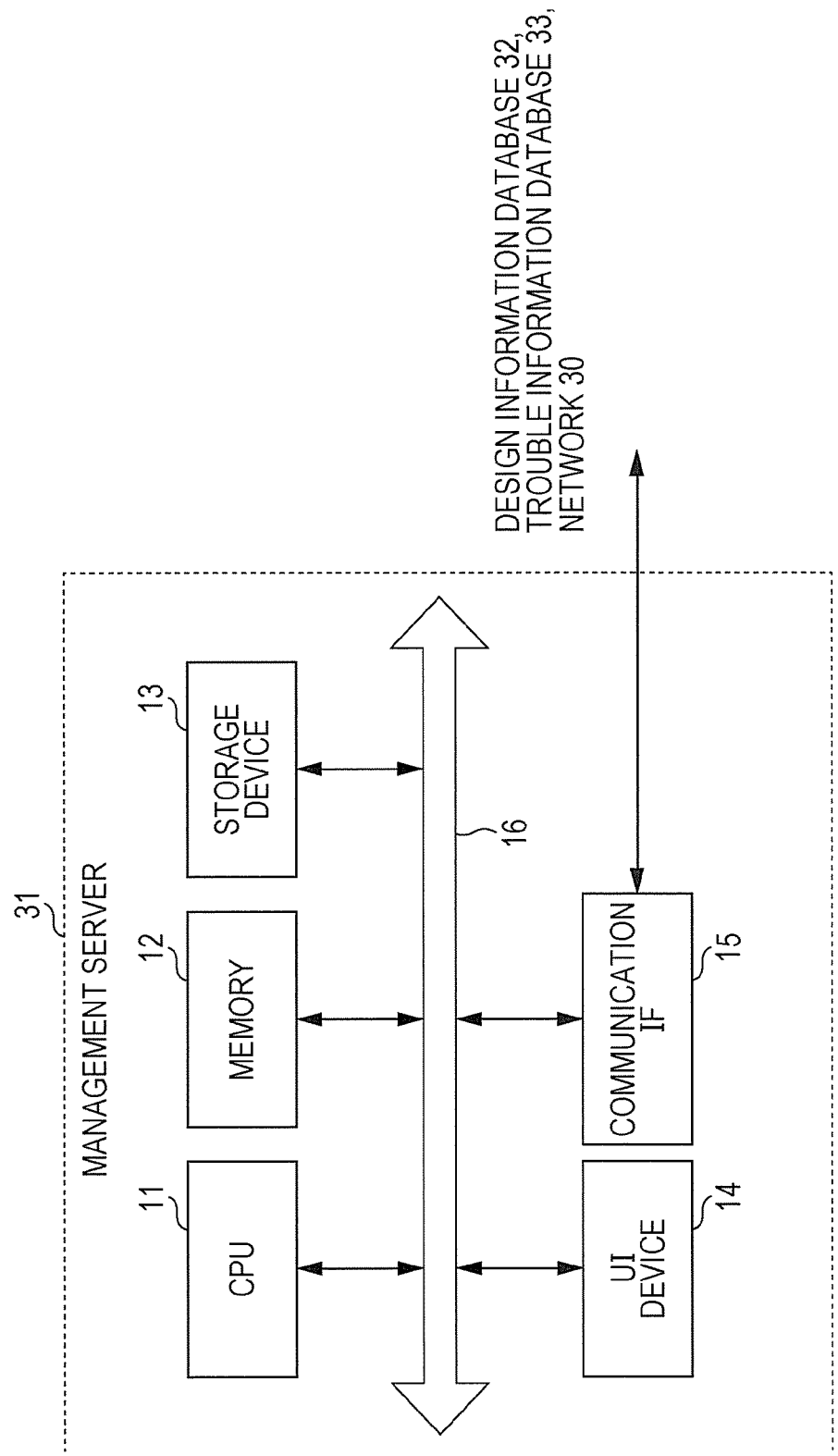

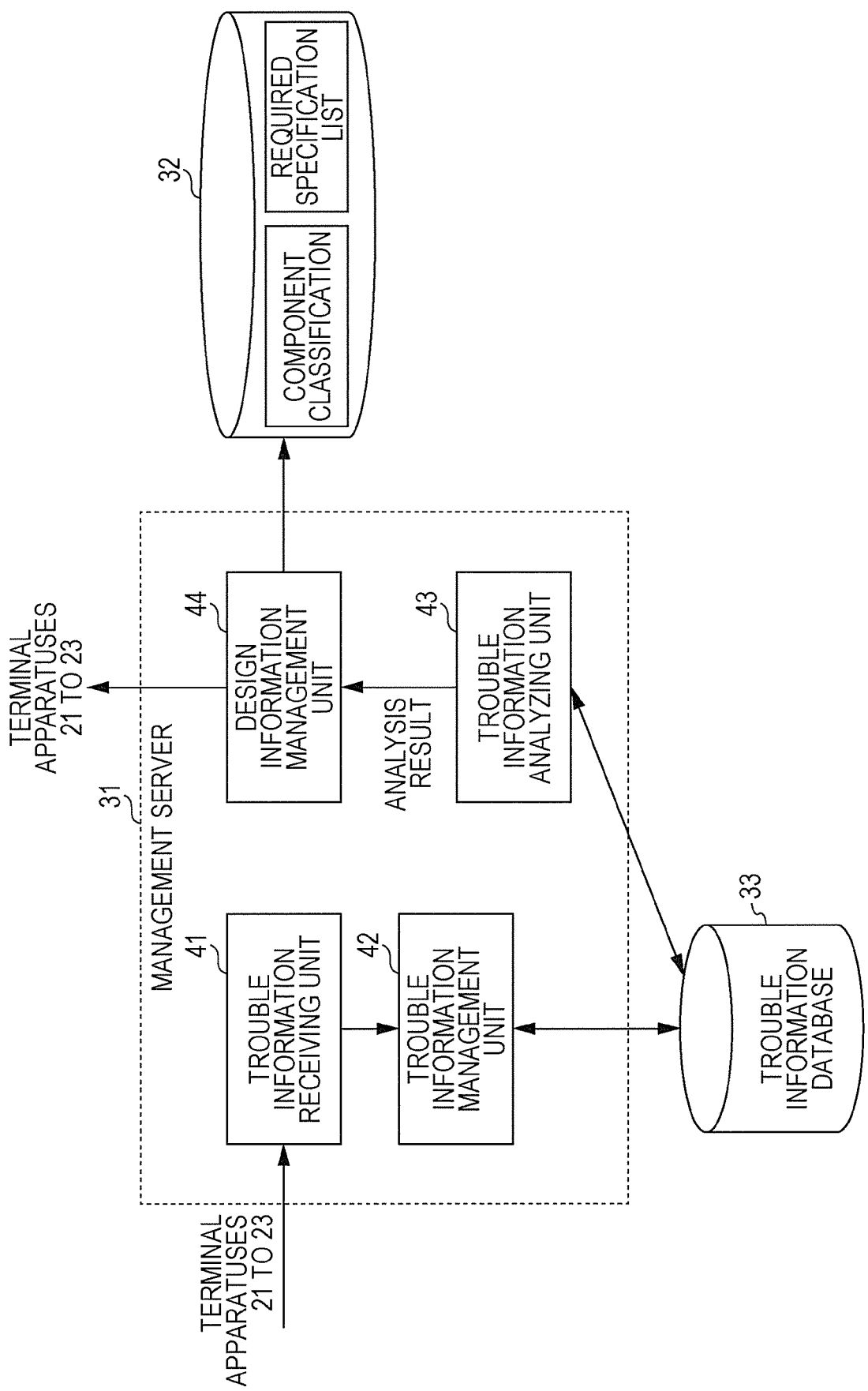

FIG. 4

| LARGE CLASSIFICATION | MIDDLE CLASSIFICATION | SMALL CLASSIFICATION |
|---|---|---|
| MECHANICAL COMPONENTS | HOUSINGS | METAL HOUSINGS |
| | | PLASTIC HOUSINGS |
| | GEARS | SPUR GEARS |
| | | SINTERED GEARS |
| | | HELICAL GEARS |
| | | WORM GEARS |
| | | BEVEL GEARS |
| | SEALS | POLYIMIDE SEALS |
| | | URETHANE SEALS |
| | | O-RINGS |
| | ⋮ | ⋮ |
| | BEARINGS | BALL BEARINGS |
| | | SINTERED BEARINGS |
| | | PLASTIC BEARINGS |
| ELECTRICAL COMPONENTS | MOTORS | AC MOTORS |
| | | DC MOTORS |
| | | STEPPING MOTORS |
| ⋮ | ⋮ | ⋮ |

FIG. 5

| PRIMARY FUNCTION | SECONDARY FUNCTION | REQUIRED SPECIFICATION TO BE MET |
|---|---|---|
| IMAGE FORMING OPERATION | DEVELOPING OPERATION | PERFORMANCE A/ EVALUATION XX OR GREATER |
| | | PERFORMANCE B/ EVALUATION YY OR GREATER |
| | FIXING PROCESS | FIXATION/ EVALUATION STANDARD GRADE 8 OR GREATER |
| | | PERFORMANCE C/ EVALUATION ZZ OR GREATER |
| | ⋮ | ⋮ |
| | MISCELLANEOUS | NO ABNORMAL HEATING IN MOTOR |
| | | PRINTING SPEED/ 40 PPM OR GREATER |
| | | NO PAPER JAM |
| | | OPERATING NOISE/ NO ABNORMAL NOISE |
| IMAGE READING OPERATION | ⋮ | ⋮ |

FIG. 6

TROUBLE REPORT

[TROUBLE NAME] POOR IMAGE QUALITY  UNEVEN DENSITY

[RELATED COMPONENT] PHOTOSENSITIVE DRUM DRIVE GEAR (0123ABC)

[CAUSE] BECAUSE GEAR MATED TO PHOTOSENSITIVE DRUM DRIVE SHAFT WAS WORN, DISTANCE BETWEEN PHOTOSENSITIVE DRUM AND CHARGER BECAME UNEVEN.
[INTERIM MEASURES] REPLACE GEAR WITH NEW ONE.

[PERMANENT MEASURES] BECAUSE CURRENT RESIN MATERIAL IS INSUFFICIENT FOR MAINTAINING MATERIAL STRENGTH MARGIN OF GEAR, IT IS DECIDED TO RE-SELECT RESIN MATERIAL.

FIG. 7

| TROUBLE CLASSIFICATION NAME | SYNONYMOUS EXPRESSIONS | | | | |
|---|---|---|---|---|---|
| PAPER JAM | JAM | SHEET JAM | PAPER STUCK | PAPER LODGED | ... |
| ABNORMAL NOISE | NOISE | BUZZ | RATTLE | RUMBLE | ... |
| ABNORMAL HEATING | OVERHEAT | SUPERHEAT | HEATING | HOT | ... |
| ... | ... | ... | ... | ... | ... |

FIG. 8A

SUBJECT  PREDICATE
BECAUSE |GEAR| IS |WORN|, ABNORMAL NOISE OCCURRED.

FIG. 8B

MODIFIER  MODIFIED WORD
ABNORMAL NOISE OCCURRED BECAUSE OF |WORN| |GEAR|.
MODIFY

FIG. 9

| TROUBLE NAME | REQUIRED SPECIFICATION TO BE MET |
|---|---|
| POOR PERFORMANCE A | PERFORMANCE A/ EVALUATION XX OR GREATER |
| POOR PERFORMANCE B | PERFORMANCE B/ EVALUATION YY OR GREATER |
| POOR FIXING | FIXATION/ EVALUATION STANDARD GRADE 8 OR GREATER |
| UNEVEN DENSITY | DENSITY VALUE ZZ OR GREATER |
| ⋮ | ⋮ |
| ABNORMAL HEATING IN MOTOR | NO ABNORMAL HEATING IN MOTOR |
| POOR PRINTING SPEED | PRINTING SPEED/ 40 PPM OR GREATER |
| PAPER JAM | NO PAPER JAM |
| ABNORMAL OPERATING SOUND | OPERATING SOUND XYZ db OR LESS |
| ⋮ | ⋮ |

FIG. 10
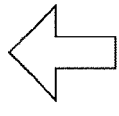
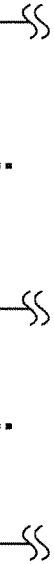

FIG. 11

ASSOCIATION

REQUIRED SPECIFICATION LIST

| PRIMARY FUNCTION | SECONDARY FUNCTION | REQUIRED SPECIFICATION TO BE MET |
|---|---|---|
| ⋮ | ⋮ | ⋯ |
| ⋮ | ⋮ | OPERATING NOISE / NO ABNORMAL NOISE |
| | ⋮ | ⋯ |
| ⋮ | ⋮ | |

WORN — BROKEN

COMPONENT CLASSIFICATION

| SMALL CLASSIFICATION | MIDDLE CLASSIFICATION | LARGE CLASSIFICATION |
|---|---|---|
| ⋯ | | |
| PAPER CONVEYANCE GEAR | ⋮ | ⋮ |
| ⋯ | | |
| PRESSURE ROLL / OUTER DIAMETER ** mm | | |
| ⋯ | | |
| ⋯ | | |
| *** MOTOR | | |
| ⋯ | | |
| *** GEAR | | |
| ⋯ | | |
| *** ASSEMBLY | | |
| ⋯ | | |

FIG. 13

SEARCH FOR PAST TROUBLE CASES

X-AXIS [ PHENOMENON ]  Y-AXIS [ TROUBLE CLASSIFICATION ]  PARAMETER [ GEAR ]

[ TWO-DIMENSIONAL DISPLAY ]  [ CLEAR ]

COMPONENT NAME (A)
- COVERS (13)
- MOTORS (10)
- BEARINGS (8)
- SCREWS (6)
- GEARS (5)
- BELTS (3)

SUBSYSTEM (B)
- CONTROL UNIT (13)
- SCANNER (10)
- CONVEYANCE SYSTEM (8)
- FIXING DEVICE (6)
- DEVELOPING DEVICE (5)
- POST-PROCESSING DEVICE (3)

MODEL (C)
- ABC1000 (18)
- XYZ2500 (9)
- AAA4200 (8)
- GGG250 (5)
- DEF400 (3)
- RST456 (3)

TROUBLE CLASSIFICATION (D)
- ABNORMAL OPERATING SOUND (19)
- PAPER JAM (12)
- POOR FIXING (11)
- POOR PRINTING SPEED (9)
- MISCELLANEOUS (3)
- ASSEMBLY PROBLEM (1)

PHENOMENON (E)
- WORN (21)
- FRACTURE (10)
- BROKEN (8)
- INTERFERE (6)
- COME OFF (5)
- SHAKY (3)

MEASURES (F)
- ADJUSTMENT (12)
- COMPONENT REPLACEMENT (11)
- MISCELLANEOUS (10)
- CHANGE (9)
- UPDATE PROGRAM (2)

DATE (G)
- 2016 (15)
- 2013 (12)
- 2014 (12)
- 2015 (11)
- 2017 (4)

PHASE (H)
- B1 (14)
- A1 (14)
- B2 (14)
- A3 (6)

INFORMATION SOURCE (I)
- RECURRENCE PREVENTION LISTS (22)
- TECHNICAL STANDARDS (11)
- BUSINESS STANDARDS (8)
- PROTOCOLS (6)
- QUALITY REPORTS (5)
- IMPROVEMENT REQUESTS (3)

FIG. 14

SEARCH FOR PAST TROUBLE CASES

SELECTED COMPONENT NAME: GEAR

X-AXIS: PHENOMENON   Y-AXIS: TROUBLE CLASSIFICATION

|  | PHENOMENON | | | | | |
|---|---|---|---|---|---|---|
|  |  | SHAKY | WORN | INTERFERE | FRACTURE | .. | .. |
| TROUBLE CLASSIFICATION | ABNORMAL OPERATING SOUND | 3 | | 1 | | | |
| | POOR FIXING | | 2 | | 1 | | |
| | UNEVEN DENSITY | | | | | | 1 |
| | ... | | | | | | |

FIG. 15

SEARCH FOR PAST TROUBLE CASES

SELECTED COMPONENT NAME: GEAR    REGISTERED INFORMATION: 2 CASES

PHENOMENON: WORN    TROUBLE CLASSIFICATION: POOR FIXING

---

TROUBLE REPORT

[TROUBLE NAME] POOR FIXING

[RELATED COMPONENT] XX GEAR

[CAUSE] BECAUSE XX GEAR WAS WORN, YYY OCCURRED, RESULTING IN POOR FIXING.

[INTERIM MEASURES] REPLACE XX GEAR WITH NEW ONE.

[PERMANENT MEASURES] REEXAMINE STRENGTH OF XX GEAR.

---

TROUBLE REPORT

[TROUBLE NAME] POOR FIXING

[RELATED COMPONENT] YY DRIVE GEAR

[CAUSE] BECAUSE YY DRIVE GEAR WAS WORN DUE TO AGING, YY WAS NOT DRIVEN NORMALLY. THUS, ZZZ BECAME XX, RESULTING IN POOR FIXING.

[INTERIM MEASURES] REPLACE YY DRIVE GEAR WITH NEW ONE.

[PERMANENT MEASURES] CONDUCT INSPECTION ON LONG-USED DEVICES.

(RETURN)

FIG. 16

SEARCH FOR PAST TROUBLE CASES

SELECTED TROUBLE CLASSIFICATION: POOR PRINTING SPEED

X-AXIS COMPONENT NAME    Y-AXIS TROUBLE CLASSIFICATION

| COMPONENT NAME | PHENOMENON | | | | | |
|---|---|---|---|---|---|---|
| | OVERHEAT | WORN | INTERFERE | FRACTURE | .. | .. |
| MOTORS | 3 | 2 | 1 | | | |
| GEARS | | 2 | | 1 | | |
| BEARINGS | | 1 | | 1 | | 1 |
| ... | | | | | | |

SUPPORT SYSTEM AND NON-TRANSITORY COMPUTER READABLE MEDIUM

CROSS-REFERENCE TO RELATED APPLICATIONS

This application is based on and claims priority under 35 USC 119 from Japanese Patent Application No. 2019-012370 filed Jan. 28, 2019.

BACKGROUND

(i) Technical Field

The present disclosure relates to a design support system and a non-transitory computer readable medium.

(ii) Related Art

Japanese Patent No. 4428110 discloses a processing apparatus that stores activity experience information, experience knowledge information, and applied activity information in association with classification of activity and classification of knowledge creation process.

Japanese Unexamined Patent Application Publication No. 2018-132882 discloses a design support system that allows, in the case of designing a product, the user to grasp a relation between a design element, such as a component included in the product, and a design requirement required for the product.

SUMMARY

Aspects of non-limiting embodiments of the present disclosure relate to providing a design support system and a non-transitory computer readable medium for narrowing down a target range to find desired information, compared with the case in which a relation between a design element such as a component included in a product and a design requirement required for the product is associated with each other regardless of the failure status of the design element.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a design support system including memory, a receiving unit, and an associating unit. The memory stores information on design element classification that classifies a design element included in a product, and information on design requirement classification that classifies a design requirement required for the product. The receiving unit receives technical information regarding a design trouble. The associating unit refers to technical information regarding a design trouble, received by the receiving unit, and associates a classification item in the design requirement classification to which the design trouble belongs and a classification item in the design element classification to which a design element causing the design trouble belongs with each other, along with information on a phenomenon indicating a failure status of the design element included in the technical information.

BRIEF DESCRIPTION OF THE DRAWINGS

An exemplary embodiment of the present disclosure will be described in detail based on the following figures, wherein:

FIG. 2 is a block diagram illustrating the hardware configuration of a management server in the design support system according to the exemplary embodiment of the present disclosure;

FIG. 3 is a block diagram illustrating the functional configuration of the management server in the design support system according to the exemplary embodiment of the present disclosure;

FIG. 4 is a diagram for describing an example of component classification stored in a design information database;

FIG. 5 is a diagram for describing an example of a required specification list stored in the design information database;

FIG. 6 is a diagram for describing an example of a trouble report;

FIG. 7 is a diagram for describing an example of a synonymous expression dictionary of trouble classification names;

FIGS. 8A and 8B are diagrams illustrating specific examples of a natural language analysis conducted by a trouble information analyzing unit;

FIG. 9 is a diagram for describing an example of a trouble name/required specification table;

FIG. 10 is a diagram for describing how a design information management unit associates, from the trouble report and the trouble name/required specification table, a required specification item in the required specification list and a classification item in the component classification with each other;

FIG. 11 is a diagram for describing how an item in the required specification list and an item in the component classification are connected according to each piece of information on a phenomenon indicating the failure status of the component;

FIG. 13 is a diagram illustrating an example of a setting screen in the case of searching for past trouble cases;

FIG. 14 is a diagram illustrating an exemplary screen displayed in the case where the component "gear" is selected as a parameter, and a search is conducted with "phenomenon" on the X-axis and "trouble classification" on the Y-axis;

FIG. 15 is a diagram illustrating an exemplary screen displayed in the case where, on the search result screen illustrated in FIG. 14, the number "2" is selected, at which the classification item "poor fixing" in the trouble classification and the classification item "worn" in the phenomenon intersect;

FIG. 16 is a diagram illustrating an exemplary screen displayed in the case where the classification item "poor printing speed" in the trouble classification is selected as a parameter, and a search is conducted with "component name" on the X-axis and "trouble classification" on the Y-axis.

DETAILED DESCRIPTION

Next, an exemplary embodiment of the present disclosure will be described in detail with reference to the drawings.

Figure 1:
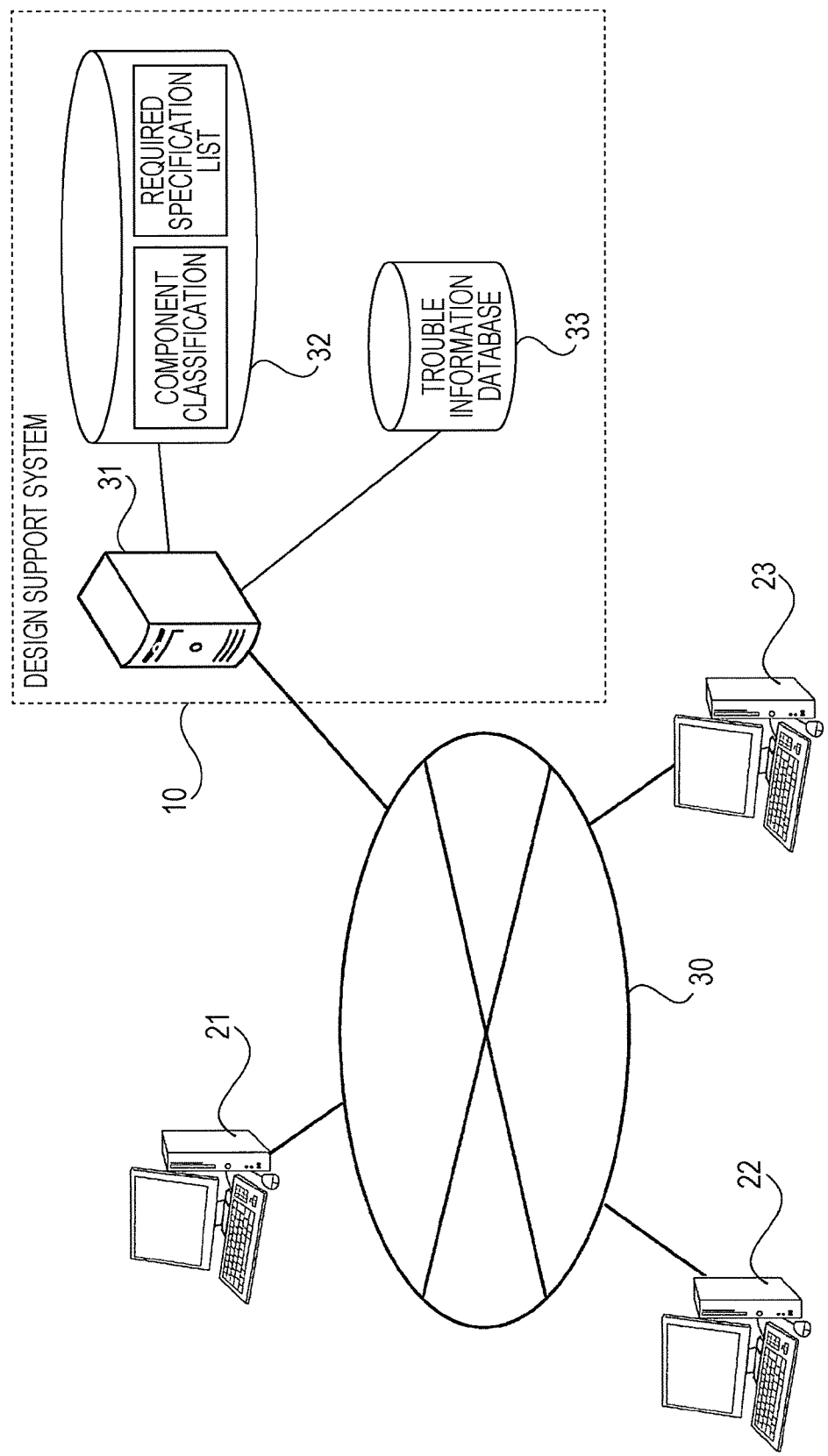
FIG. 1 is a diagram illustrating the configuration of the whole system including a design support system according to an exemplary embodiment of the present disclosure.

FIG. 1 is a diagram illustrating the whole system including a design support system 10 according to the exemplary embodiment of the present disclosure.

The design support system 10 according to the exemplary embodiment of the present disclosure is connected to terminal apparatuses 21 to 23 via a network 30, as illustrated in FIG. 1. Here, the terminal apparatuses 21 to 23 are installed in a development design department, a quality control department, and a manufacturing department, respectively. Although the description of the present exemplary embodiment assumes that only three terminal apparatuses 21 to 23 are connected to the design support system 10 in order to simplify the description, actually many terminal apparatuses may be connected to the design support system 10.

In addition, the design support system 10 includes a management server 31, a design information database 32, and a trouble information database 33.

The design information database 32 stores component classification (an example of design element classification) that classifies a component (an example of a design element) included in a product, and a design specification list (an example of design requirement classification) that classifies a design specification (an example of a design requirement) required for the product. Note that the component classification and the design specification list will be described in detail later.

Here, the term "product" is an expression not referring to an identical model with an identical product number, but rather is an expression including a plurality of models with an identical or similar functions.

The trouble information database 33 stores trouble reports describing the details of trouble cases that occurred on the market, market service documents describing how to handle troubles on the market, and various types of technical information regarding design troubles, such as technical standards. These pieces of technical information regarding design troubles are respectively input to the terminal apparatuses 21 to 23 in the development design department, the quality control department, and the manufacturing department, and stored in the trouble information database 33 via the management server 31 of the design support system 10.

Next, FIG. 2 illustrates the hardware configuration of the management server 31 in the design support system 10 according to the present exemplary embodiment.

The management server 31 includes, as illustrated in FIG. 2, a central processing unit (CPU) 11, memory 12, a storage device 13 such as a hard disk drive (HDD), a user interface (UI) device 14, and a communication interface (IF) 15 that performs transmission and reception of data to and from external apparatuses such as the terminal apparatuses 21 to 23 via the design information database 32, the trouble information database 33, and the network 30. These elements are connected to one another via a control bus 16.

The CPU 11 executes a certain process based on a control program stored in the memory 12 or the storage device 13, and controls the operation of the management server 31.

Although the exemplary embodiment has discussed that the CPU 11 reads and executes the control program stored in the memory 12 or the storage device 13, the program may be stored in a storage medium such as compact-disc read-only memory (CD-ROM) and may be provided to the CPU 11.

FIG. 3 is a block diagram illustrating the functional configuration of the management server 31 realized by execution of the above-mentioned control program.

The management server 31 in the present exemplary embodiment includes, as illustrated in FIG. 3, a trouble information receiving unit 41, a trouble information management unit 42, a trouble information analyzing unit 43, and a design information management unit 44. The management server 31 manages the design information database 32 and the trouble information database 33.

The design information database 32 in the present exemplary embodiment stores component classification that classifies components included in each product, and a required specification list that classifies required specifications of each product.

An example of the component classification will be described with reference to FIG. 4. In an exemplary component classification table illustrated in FIG. 4, components included in a product, such as an image forming apparatus, are classified hierarchically as in, for example, large classification, middle classification, and small classification. Small classification, which is the narrowest classification, contains component classification names, and classifies components into, for example, "metal housing" and "plastic housing".

Although each component is indicated simply by its component classification name in FIG. 4 in order to simplify the description, each component is actually classified in more detail in the component classification table according to, for example, component number, component attribute, characteristics, and so forth. Specifically, each classification item in the component classification has an attribute value, such as weight, length, material standard number, or maximum input voltage, and information which is a corresponding component number. Furthermore, the component number is linked to information such as drawings, purchase cost, and market quality.

Next, FIG. 5 illustrates an example of the required specification list stored in the design information database 32. The required specification list illustrated in FIG. 5 indicates classification of a required specification required for an apparatus which is a so-called multifunctional peripheral with multiple functions, such as a print function, a scan function, a copy function, and a fax function. Specifically, various required specifications such as fixability in a fixing process, printing speed, and operation noise are indicated in the form of a list.

The trouble information receiving unit 41 receives technical information regarding design troubles, input by the terminal apparatuses 21 to 23 in various departments such as the development department, the quality control department, and the manufacturing department.

FIG. 6 illustrates an example of a trouble report which is one piece of such technical information.

In the exemplary trouble report illustrated in FIG. 6, it is clear that the trouble name is "poor image quality, uneven density", and pieces of information such as the name and product number of a related component which is a component related to this trouble, the details of the trouble, and measures taken to handle the trouble are described.

The trouble information management unit 42 stores and manages technical information regarding such a design trouble, received by the trouble information receiving unit 41, as trouble information in the trouble information database 33.

The trouble information analyzing unit 43 conducts natural language analysis processing such as text mining on technical information regarding a design trouble, stored in the trouble information database 33, thereby analyzing the details of the design trouble, a component causing the design trouble, and a phenomenon indicating the failure status of the component, which are described in the technical information.

Specifically, the trouble information analyzing unit 43 stores a synonym dictionary containing a group of synonyms expressing an identical classification item in different words, and, in the case of conducting a natural language analysis on technical information regarding a design trouble, analyzes the details of the design trouble and a design element causing the design trouble using this synonym dictionary.

For example, even in the case where the name "paper jam" is registered as a trouble classification name, an actual trouble report or the like may describe this trouble case in various expressions such as "jam", "jamming", "sheet jam", "paper stuck", "paper lodged", and "poor sheet conveyance".

Therefore, a synonymous expression dictionary of trouble classification names such as that illustrated in FIG. 7 is prepared in advance, and the trouble information analyzing unit 43 refers to the synonymous expression dictionary to analyze a trouble classification item in a technical document such as a trouble report.

The same applies to component names. Even in the case where the component classification name "fixing roll" is registered, an actual trouble report or the like may describe the component name in various expressions such as "fixing roller", "heating roll", "heating roller", "fuser", "fuser roller", and "fuser roll".

Therefore, a synonymous expression dictionary of an identical component classification name is prepared in advance for component classification names, and the trouble information analyzing unit 43 may use the synonymous expression dictionary to analyze a component causing a trouble from a technical document such as a trouble report.

Furthermore, when conducting a natural language analysis on technical information regarding a design trouble, the trouble information analyzing unit 43 extracts a predicate that receives a subject in the case where the word of a component serves as the subject, or a modifier that modifies a modified word in the case where the word of a component serves as the modified word, as a word representing a phenomenon indicating the failure status of the component.

FIGS. 8A and 8B illustrate specific examples of such a natural language analysis. For example, FIG. 8A illustrates the case in which, in the case where the word of the component "gear" serves as a subject, the word "worn" which serves as a predicate that receives the subject is extracted as a word representing a phenomenon indicating the failure status of the component "gear". FIG. 8B illustrates the case in which, in the case where the word of the component "gear" serves as a modified word, the word "worn" which is a modifier that modifies the modified word is extracted as a word representing a phenomenon indicating the failure status of the component "gear".

The design information management unit 44 refers to technical information regarding a design trouble, received by the trouble information receiving unit 41 and stored in the trouble information database 33, to select a classification item to which this design trouble belongs from the required specification list (an example of design requirement classification), and selects a classification item to which a component (an example of a design element) causing the design trouble belongs from the component classification.

Specifically, the design information management unit 44 selects, on the basis of an analysis result obtained by the trouble information analyzing unit 43, a classification item to which this design trouble belongs from the required specification list, and selects a classification item to which a component causing the design trouble belongs from the component classification.

The design information management unit 44 associates, for the component classification and the required specification list stored in the design information database 32, the selected classification item in the design specification list and the selected classification item in the component clarification with each other, along with information on a phenomenon indicating the failure status of the component.

In other words, the design information management unit 44 refers to technical information regarding a design trouble, received by the trouble information receiving unit 41, to associate a classification item in the design specification list to which this design trouble belongs and a classification item in the component classification to which a component causing this design trouble belongs with each other, along with information on a phenomenon indicating the failure status of the component included in the technical information.

Note that a design requirement which is a requirement in terms of design required for a certain product is inseparable from a design trouble which is malfunction caused by design. In other words, the fact that a certain requirement is not met causes a design trouble.

Although the required specification list is used as design requirement classification in the present exemplary embodiment, an actual trouble report or the like generally describes a trouble name, not a design requirement item. Therefore, even in the case where a trouble report or the like is analyzed, this may not be directly linked to a classification item in the design requirement.

Therefore, the design information management unit 44 in the present exemplary embodiment stores in advance a trouble name/required specification table indicating relations between trouble names and required specifications, such as that illustrated in FIG. 9, and performs processing to convert a trouble name obtained from a trouble report or the like to a required specification.

For example, if reference is made to this trouble name/required specification table, it is clear that the trouble name "poor fixing" corresponds to "fixation" which serves as a required specification to be met.

In addition, the design information management unit 44 links a technical document such as a trouble report to an associated classification item in the component classification and to an associated classification item in the design specification list.

In response to retrieval of the classification item of a certain component in the component classification, the design information management unit 44 outputs a classification item in the design specification list that is associated with the retrieved classification item of the component, along with information on the number of occurrences of design trouble for each phenomenon indicating the failure status of the component. At that time, the design information management unit 44 outputs classification items in the design specification list in descending order of the number of occurrences of design trouble.

In response to retrieval of the classification item of a certain design specification in the required specification list, the design information management unit 44 outputs a classification item in the component classification that is associated with the retrieved classification item of the design specification, along with information on the number of occurrences of design trouble for each phenomenon indicating the failure status of the component.

Furthermore, in the case where any of information on a classification item in the required specification list, information on a classification item in the component classification, and information on a phenomenon indicating the failure status is specified, the design information management unit 44 may associatively output the other two pieces of information that are associated in the design information database 32 with the specified piece of information.

In the case where information on the number of occurrences of design trouble is selected, the design information management unit 44 outputs technical information regarding a design trouble corresponding to the selected information on the number of occurrences of design trouble.

As has been described above, the design information management unit 44 executes processing to associate (or link), from a technical document such as a trouble report received by the trouble information receiving unit 41 and the trouble name/required specification table illustrated in FIG. 9, a required specification item in the required specification list and a classification item in the component classification with each other, as illustrated in FIG. 10, along with information on a phenomenon indicating the failure status of the component.

In the specific example illustrated in FIG. 10, the trouble report is about "uneven density", and a component related to this design trouble is "photosensitive drum drive gear". Thus, it is clear that the item "density value ZZ or greater" in the required specification list, and the item "photosensitive drum drive gear" in the component classification are associated with each other, along with "worn", which is information on a phenomenon indicating the failure status of the component.

Even in the case of an identical combination of an item in the required specification list and an item in the component classification, if information on a phenomenon indicating the failure status of the component is different, the design information management unit 44 associates, for each piece of information on a phenomenon indicating the failure status of the component, an item in the required specification list and an item in the component classification with each other.

For example, in the example illustrated in FIG. 11, the item "operation noise/no abnormal noise" in the required specification list, and the item "paper conveyance gear" in the component classification are connected for each of "worn" and "broken", which are pieces of information on a phenomenon indicating the failure status of the component.

Figure 12:
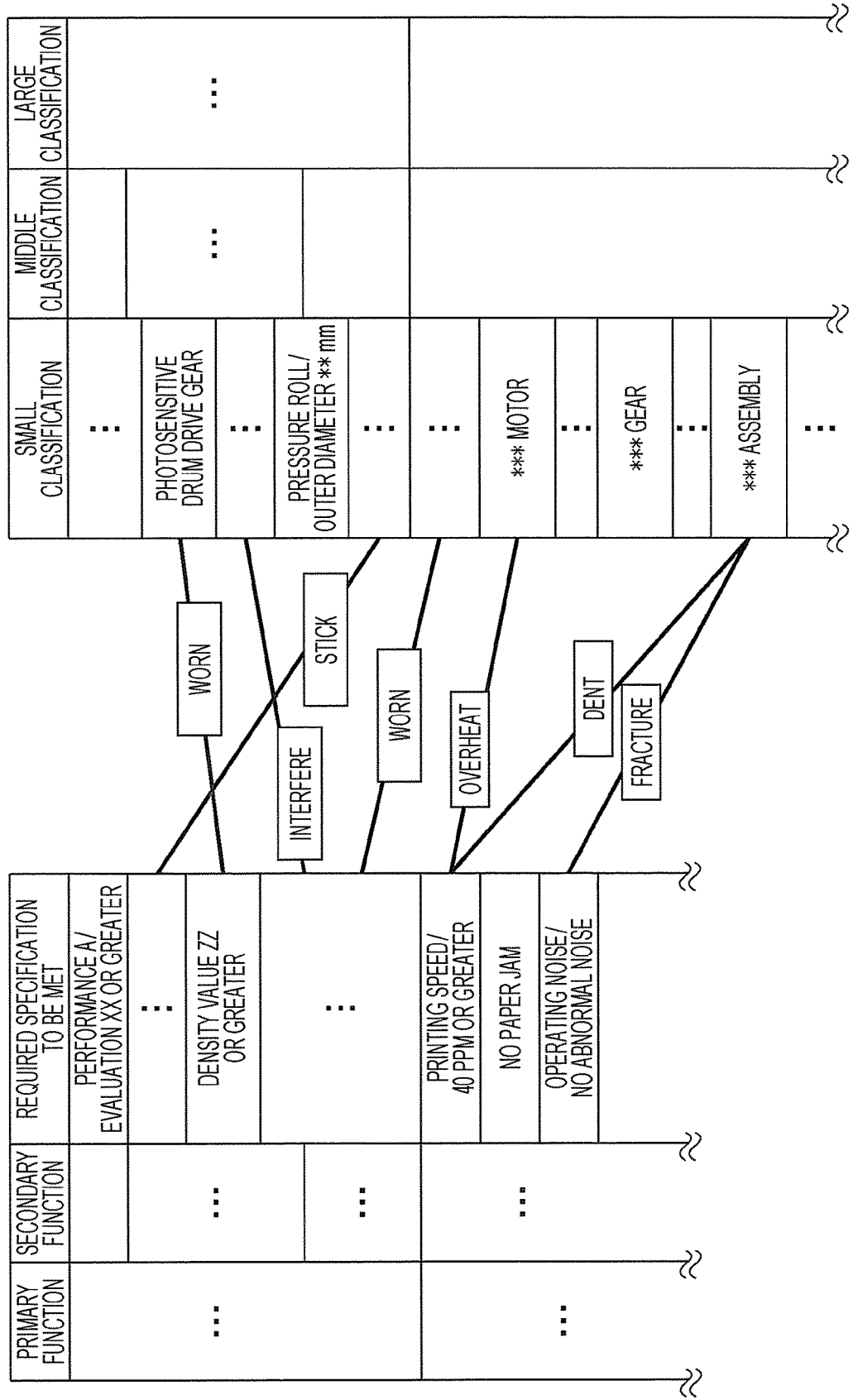
FIG. 12 is a diagram for describing how the design information management unit sequentially associates required specification items and component classification items with each other.

As illustrated in FIG. 12, the design information management unit 44 sequentially associates, for each of technical documents regarding a design trouble, stored in the trouble information database 33, a required specification item and a component classification item with each other, along with information on a phenomenon indicating the failure status of the component.

In other words, by following this association, it may be possible to understand, if any requirement is not met, which selected component has a problem, or, if any selected component has a problem, which required specification may not be met.

In addition, by following this association, it may be possible to understand, if any requirement is not met, which component is broken in what way, or, if any component is broken in what way, which required specification may not be met.

Next, an example of a specific operation screen in the case of searching for past trouble cases in the design support system 10 according to the present exemplary embodiment will be described.

At first, FIG. 13 illustrates an example of a setting screen in the case of searching for past trouble cases.

On the setting screen illustrated in FIG. 13, the case in which pieces of past trouble information are classified into nine types, that is, "component name", "subsystem", "model", "trouble classification", "phenomenon", "measures", "date", "phase", and "information source" are indicated.

It is possible to select a parameter for searching for past trouble information that the user wants to know, and which classification will be plotted on the X-axis and on the Y-axis when displaying a search result in two dimensions.

For example, FIG. 14 illustrates an exemplary screen displayed in the case where the component "gear" is selected as a parameter, and a search is conducted with "phenomenon" on the X-axis and "trouble classification" on the Y-axis.

By referring to the exemplary screen illustrated in FIG. 14, troubles caused by the component "gear" are displayed at the top in descending order of the number of cases, and for each trouble, phenomena in which "gear" is broken are displayed on the left in descending order.

FIG. 14 indicates number-of-cases information (that is, information on the number of occurrences) indicating how many pieces of trouble information in which the cause of the trouble is "gear" are there in each item of two-dimensional display with trouble classification plotted on the X-axis and a phenomenon plotted on the Y-axis.

If the user selects displayed number-of-cases information on the search result screen illustrated in FIG. 14, trouble reports registered as pieces of number-of-cases information are displayed.

For example, FIG. 15 illustrates an exemplary screen displayed in the case where, on the search result screen illustrated in FIG. 14, the number "2" is selected, at which the classification item "poor fixing" in the trouble classification and the classification item "worn" in the phenomenon intersect.

On the exemplary screen illustrated in FIG. 15, it is clear that trouble reports in which the cause of the trouble is "gear", a phenomenon indicating the failure status of the component is "worn", and the trouble classification is "poor fixing" are displayed on the screen.

In addition, FIG. 16 illustrates an exemplary screen displayed in the case where the classification component "poor printing speed" in the trouble classification is selected as a parameter, and a search is conducted with "component name" on the X-axis and "trouble classification" on the Y-axis.

By referring to the exemplary screen illustrated in FIG. 16, the component names of components causing the trouble "poor printing speed" are displayed at the top in descending order of the number of cases, and for each component name, phenomena in which the component is broken are displayed on the left in descending order.

Although the above-described exemplary embodiment discusses the case in which a design specification list indicating a list of design specifications required for a product of interest serves as design requirement classification, trouble classification that classifies design troubles occurring in a product of interest may serve as design requirement classification.

By using trouble classification as design requirement classification in this manner, a trouble name/required specification table such as that illustrated in FIG. 9 becomes unnecessary.

Figure 17:
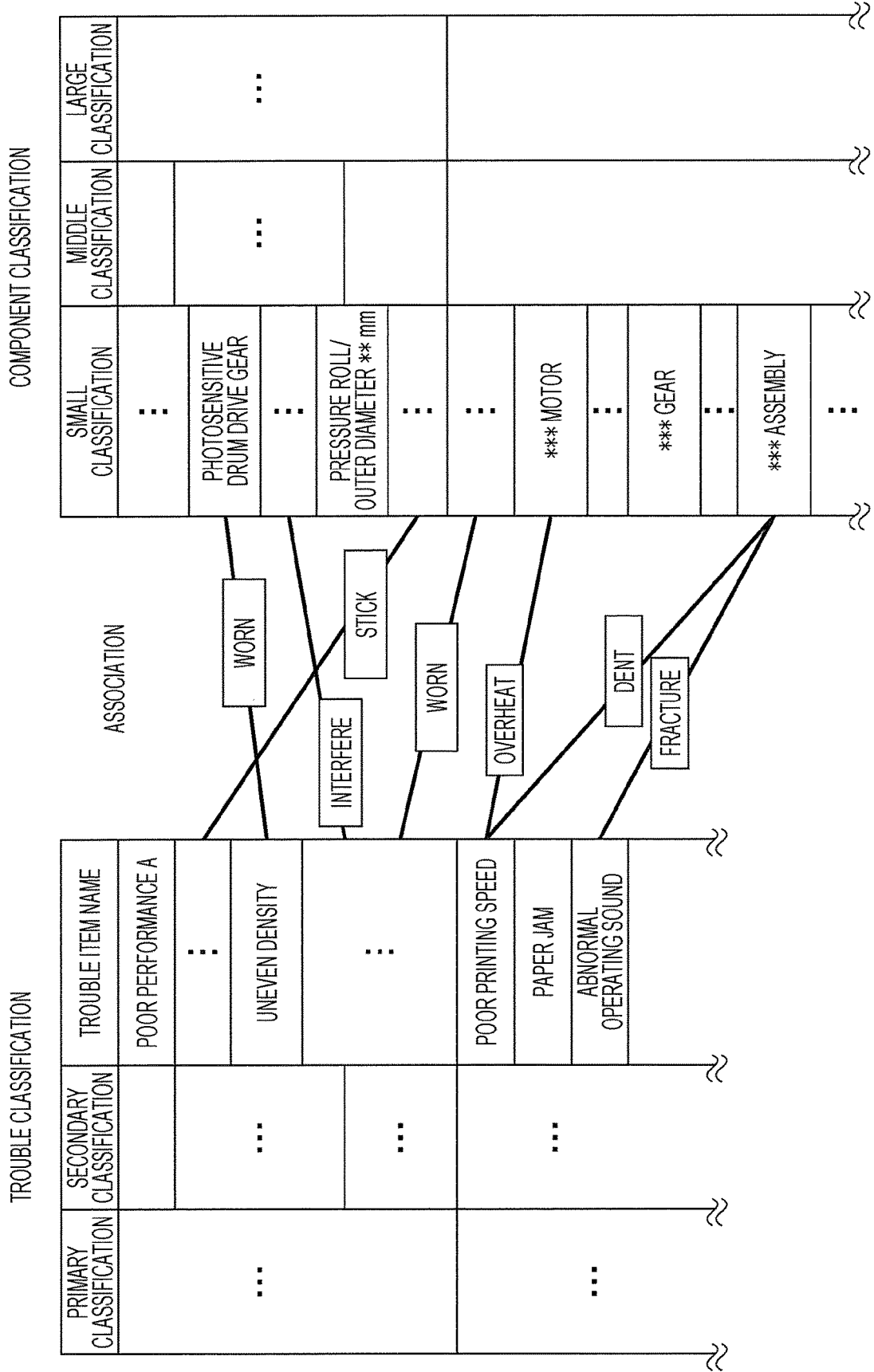
FIG. 17 is a diagram for describing how a classification item in the trouble classification and a classification item in the component classification are associated with each other in the case where the trouble classification is used as design requirement classification.

In such a case, as illustrated in FIG. 17, the design information management unit 44 refers to technical information regarding a design trouble, stored in the trouble information database 33, selects a classification item to which this design trouble belongs from the trouble classification, selects a classification item to which a component causing this design trouble belongs from the component classification, and associates the selected classification item in the trouble classification and the selected classification item in the component classification with each other, along with information on a phenomenon indicating the failure status of the component.

The foregoing description of the exemplary embodiment of the present disclosure has been provided for the purposes of illustration and description. It is not intended to be exhaustive or to limit the disclosure to the precise forms disclosed. Obviously, many modifications and variations will be apparent to practitioners skilled in the art. The embodiment was chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A design support system comprising:
   memory that stores information on design element classification that classifies a design element included in a product, and information on design requirement classification that classifies a design requirement required for the product;
   a receiving unit that receives technical information regarding a design trouble;
   an associating unit that refers to technical information regarding a design trouble, received by the receiving unit, and associates a classification item in the design requirement classification to which the design trouble belongs and a classification item in the design element classification to which a design element causing the design trouble belongs with each other, along with information on a phenomenon indicating a failure status of the design element included in the technical information; and
   an output unit that, in response to retrieval of a classification item of a certain design element in the design element classification, outputs a classification item in the design requirement classification associated with the retrieved classification item of the design element, along with information on a number of occurrences of design trouble for each phenomenon indicating a failure status of the design element,
   wherein, in a case where information on the number of occurrences of design trouble is selected, the output unit outputs technical information regarding a design trouble corresponding to the selected information on the number of occurrences of design trouble.

2. The design support system according to claim 1, further comprising:
   an analyzing unit that analyzes details of the design trouble, a design element causing the design trouble, and a phenomenon indicating a failure status of the design element by conducting a natural language analysis on the technical information regarding the design trouble,
   wherein, on the basis of an analysis result obtained by the analyzing unit, the associating unit associates a classification item in the design requirement classification to which the design trouble belongs and a classification item in the design element classification to which a design element causing the design trouble belongs with each other, along with information on a phenomenon indicating a failure status of the design element included in the technical information.

3. The design support system according to claim 2, wherein, when conducting a natural language analysis on the technical information regarding the design trouble, the analyzing unit extracts a predicate that receives a subject in a case where a word of a design element serves as the subject, or a modifier that modifies a modified word in a case where a word of a design element serves as the modified word, as a word representing a phenomenon indicating a failure status of the design element.

4. The design support system according to claim 2, wherein:
   the analyzing unit stores a synonym dictionary containing a group of a plurality of synonyms that express an identical classification item in different words, and
   when conducting a natural language analysis on the technical information regarding the design trouble, the analyzing unit analyzes details of the design trouble and a design element causing the design trouble using the synonym dictionary.

5. The design support system according to claim 3, wherein:
   the analyzing unit stores a synonym dictionary containing a group of a plurality of synonyms that express an identical classification item in different words, and
   when conducting a natural language analysis on the technical information regarding the design trouble, the analyzing unit analyzes details of the design trouble and a design element causing the design trouble using the synonym dictionary.

6. The design support system according to claim 2, wherein the output unit further comprises:
   in response to retrieval of a classification item of a certain design requirement in the design requirement classification, outputting a classification item in the design element classification associated with the retrieved classification item of the design requirement, along with information on a number of occurrences of design trouble for each phenomenon indicating a failure status of the design element.

7. The design support system according to claim 3, wherein the output unit further comprises:
   in response to retrieval of a classification item of a certain design requirement in the design requirement classification, outputting a classification item in the design element classification associated with the retrieved classification item of the design requirement, along with information on a number of occurrences of design trouble for each phenomenon indicating a failure status of the design element.

8. The design support system according to claim 4, wherein the output unit further comprises:

in response to retrieval of a classification item of a certain design requirement in the design requirement classification, outputting a classification item in the design element classification associated with the retrieved classification item of the design requirement, along with information on a number of occurrences of design trouble for each phenomenon indicating a failure status of the design element.

9. The design support system according to claim 1, wherein the output unit further comprises:
in a case where any of information on a classification item in the design requirement classification, information on a classification item in the design element classification, and information on a phenomenon indicating the failure status is specified, associatively outputting the other two pieces of information that are associated in the memory with the specified piece of information.

10. The design support system according to claim 1, wherein the design element classification is component classification that classifies a component included in a product, and the design requirement classification is a design specification list indicating a list of design specifications required for the product.

11. The design support system according to claim 1, wherein the design element classification is component classification that classifies a component included in a product, and the design requirement classification is trouble classification that classifies a design trouble occurring in the product.

12. A non-transitory computer readable medium storing a program causing a computer to execute a process, the process comprising:
receiving technical information regarding a design trouble;
referring to technical information regarding a design trouble, received in the receiving, and associating a classification item in design requirement classification to which the design trouble belongs and a classification item in design element classification to which a design element causing the design trouble belongs with each other, along with information on a phenomenon indicating a failure status of the design element included in the technical information; and
in response to retrieval of a classification item of a certain design element in the design element classification, outputting a classification item in the design requirement classification associated with the retrieved classification item of the design element, along with information on a number of occurrences of design trouble for each phenomenon indicating a failure status of the design element,
wherein, in a case where information on the number of occurrences of design trouble is selected, the process outputs technical information regarding a design trouble corresponding to the selected information on the number of occurrences of design trouble.

13. A non-transitory computer readable medium storing a program causing a computer to execute a process, the process comprising:
by analyzing technical information regarding a design trouble, storing information on a classification item in design requirement classification to which the design trouble belongs and classification item information in design element classification to which a design element causing the design trouble belongs in association with each other, along with information on a phenomenon indicating a failure status of the design element included in the technical information;
in a case where any of information on a classification item in the design requirement classification, information on a classification item in the design element classification, and information on a phenomenon indicating the failure status is specified, applying control to associatively display, on a display, the other two pieces of information that are associated in the storing with the specified piece of information; and
in response to retrieval of a classification item of a certain design element in the design element classification, outputting a classification item in the design requirement classification associated with the retrieved classification item of the design element, along with information on a number of occurrences of design trouble for each phenomenon indicating a failure status of the design element,
wherein, in a case where information on the number of occurrences of design trouble is selected, the process outputs technical information regarding a design trouble corresponding to the selected information on the number of occurrences of design trouble.

* * * * *